(12) United States Patent
Tauchi et al.

(10) Patent No.: US 6,316,279 B1
(45) Date of Patent: Nov. 13, 2001

(54) METHOD OF PRODUCING THERMOELECTRIC SEMICONDUCTOR

(75) Inventors: Hitoshi Tauchi, Anjo; Atsushi Tomita, Chiryu; Kazuo Ebisumori, Toyota, all of (JP)

(73) Assignee: Aisin Seiki Kabushiki Kaisha, Kariya (JP)

(*) Notice: Subject to any disclaimer, the term of this patent is extended or adjusted under 35 U.S.C. 154(b) by 0 days.

(21) Appl. No.: 09/513,465

(22) Filed: Feb. 25, 2000

(30) Foreign Application Priority Data

Feb. 25, 1999 (JP) .................................................. 11-048270

(51) Int. Cl.[7] .................................................. H01L 21/00
(52) U.S. Cl. .................................................. 438/22
(58) Field of Search .................................................. 438/22, 46, 54, 438/55, 800; 257/64, 618, 712, 930; 136/200, 201, 236.1, 238, 239, 240; 62/3.2

(56) References Cited

U.S. PATENT DOCUMENTS 5,959,341 * 9/1999 Tsuno et al. .................... 257/467
6,147,293 * 9/1999 Tauchi et al. ..................... 136/236.1

FOREIGN PATENT DOCUMENTS

| 62-264682 | 11/1987 | (JP) . |
| 10-178218 | * 9/1997 | (JP) . |
| 10112558 | 4/1998 | (JP) . |
| 10178218 | 6/1998 | (JP) . |
| 10178219 | 6/1998 | (JP) . |

* cited by examiner

*Primary Examiner*—Keith Christianson
(74) *Attorney, Agent, or Firm*—Oblon, Spivak, McClelland, Maier & Neustadt, P.C.

(57) ABSTRACT

In order to provide a high mechanical strength and a progressive performance index resulting from an improved electric conductivity, a thermoelectric semiconductor is made by arranging a plurality of extruded bar-shaped thermoelectric semiconductor materials B1 in a bundle. The resulting bar-shaped thermoelectric semiconductor materials B1 are sintered and integrated concurrently by applying a force to each bar-shaped thermoelectric material B1 along a direction L2 perpendicular to an axis L1 thereof. This causes flows of materials, thereby further orientating cleavage planes which causes an advanced orientation effect.

8 Claims, 9 Drawing Sheets

METHOD OF PRODUCING THERMOELECTRIC SEMICONDUCTOR

BACKGROUND OF THE INVENTION

1. Field of the Invention

The present invention is directed to a method of producing a thermoelectric semiconductor which is used, particularly, as a thermoelectric cooling element.

2. Discussion of the Background

As a conventional thermoelectric semiconductor compound, a crystal is well known which is obtained by solidifying a thermoelectric semiconductor material, such as a bismuth-tellurium series, through one of the Bridgman technique and Zone melting crystallization. However, such a one-way crystallized thermoelectric semiconductor crystal has cleavage along planes determined by bonding surfaces of tellurium-tellurium, which results in it being brittle. Thus, employing such a one-way crystallized thermoelectric semiconductor as a thermoelectric cooling element inevitably causes problems in reliability and/or mechanical strength.

In order to overcome such serious problems from the viewpoint of practical use, especially for improving mechanical strength, Japanese Patent Laid-open Print No Sho.62-264682 (published in 1987 without examination) provides a new thermoelectric semiconductor which is produced by the following steps: powdering a crystalline body of a thermoelectric semiconductor, and sintering the resultant powdered material while applying a force thereto along one direction. Due to the fact that the thermoelectric semiconductor is applied with the force along only one direction, the cleavage planes are oriented in a direction perpendicular to the force application direction. Thus, applying en electric current along each of the resultant cleavage planes utilizes or activates the electrical isotropy of the crystalline body of the thermoelectric semiconductor, in addition to achieving an improved mechanical strength which results from the sintering.

However, in this method, before performing the foregoing sintering under pressure, the powdered thermoelectric semiconductor is placed in a mold device and hot pressed, which results in that orientation of each cleavage plane is restricted or limited, thereby inhibiting the electrical isotropy of the bismuth-tellurium series thermoelectric semiconductor as an original property thereof.

By contrast, Japanese Patent Laid-open Print No. Hei. 10-112558 published in 1998 without examination provides a method of producing a thermoelectric semiconductor having the following steps: powdering a thermoelectric semiconductor material, and sintering such a powdered thermoelectric semiconductor during extrusion. In the resultant sintered thermoelectric semiconductor body, cleavage planes are oriented along the extruding direction, thereby improving the electric conductivity of the thermoelectric semiconductor body.

However, even the foregoing newly published sintering methods as described above fail to provide a remarkable improvement in the electric conductivity of the thermoelectric semiconductor, and the performance index is at most less than 3.5, which is not satisfactory from the view point of practical use.

Thus, there is a need for a further developed method of producing a thermoelectric semiconductor which is excellent in electric conductivity, and correspondingly performance index, and which is mechanically strong.

SUMMARY OF THE INVENTION

The present invention has been developed to satisfy the need noted above, and thus has a primary object to provide a method of producing a thermoelectric semiconductor which, in addition to having a high mechanical strength, has a good performance index resulting from improved electric conductivity.

A first aspect of the present invention provides a method of producing a thermoelectric semiconductor which comprises an extrusion step for obtaining a plurality of bar-shaped thermoelectric semiconductor materials by extruding either a powdered thermoelectric semiconductor crystal or a pressed body of a powdered thermoelectric semiconductor crystal; and a sintering and integration step for obtaining an integrated sintered body by sintering and integrating the plural bar-shaped thermoelectric semiconductor materials after arranging the plural bar-shaped thermoelectric semiconductor materials in side-by-side fashion to constitute a bundle. The sintering is done currently with or prior to the integrating. The integrating is done by applying a force to the bundle of thermoelectric semiconductor materials along a direction which is perpendicular to an axis of each of the bar-shaped thermoelectric semiconductor materials.

In accordance with the first aspect of the present invention, during the extrusion step, in the thermoelectric semiconductor crystal, flows of materials occur along the direction of the force application or the axial direction of the bar-shaped thermoelectric semiconductor material, which causes orientations of the cleavage planes. In addition, during the sintering and integration step, each of the bar-shaped thermoelectric semiconductor materials is applied with the force along a direction perpendicular to its axis, which causes further flows of materials along the direction of the axis, resulting in further orientations of the cleavage planes. Thus, in comparison with a thermoelectric semiconductor obtained by a conventional method, the present invention provides an increased orientation effect as a result of the sintering and integration step, thereby improving the electric conductivity along such a direction. Thus, the first aspect of the present invention enables the thermoelectric semiconductor to increase its performance index.

As a second aspect of the present invention, a deformation step for deforming the integrated sintered body is performed by applying a deforming force thereto which causes an extension thereof in such a manner that a direction of the deforming force is perpendicular to the axis of the each of the thermoelectric semiconductor materials, the direction of the extension of the integrated sintered body being perpendicular to the direction of the deforming force.

In accordance with the second aspect of the present invention, flows of materials occur along a direction, or the extension direction which is perpendicular to the direction of the force application, which increases the orientation effect along such a direction. Due to the fact that the direction of the force application is perpendicular to the axis of each of the bar-shaped thermoelectric semiconductor materials which constitute the sintered body, the direction of the orientation of cleavage planes comes to coincide with the axis, which provides the increased orientation effect, thereby improving the electric conductivity. Thus, the second aspect of the present invention enables the thermoelectric semiconductor to increase its performance index.

As a third aspect of the present invention, the deformation step employs a molding device having cavity whose diameter is larger than a maximum diameter of a plane of the body which is perpendicular to the direction of the deforming force, the body is put in the cavity and is pressed in the cavity along the direction of the deforming force, thereby causing an extension thereof along a direction perpendicular to the direction of the deforming force.

In accordance with the third aspect of the present invention, the body of the thermoelectric semiconductor is placed in the cavity of the mold device so as to define a gap between the body and the cavity, which fills up with gas when the body is pressed. Such pressing allows a uniform extension degree of the body when mass produced. Thus, constant electric anisotropy of the thermoelectric semiconductor can be reserved, thereby stabilizing the quality and/or performance index thereof. In addition, cracks of the thermoelectric semiconductor can be prevented, thereby increasing its mechanical strength.

A fourth aspect of the present invention provides a method of producing a thermoelectric semiconductor by an extension and sintering step for obtaining a plurality of bar-shaped thermoelectric semiconductor materials by extruding and sintering concurrently either a powdered the thermoelectric semiconductor crystal or a pressed body of a powdered thermoelectric semiconductor crystal; and an integration step for obtaining an integrated sintered body by integrating the plural bar-shaped thermoelectric semiconductor materials after arranging the plural bar-shaped thermoelectric semiconductor materials in side-by-side fashion to constitute a bundle. The integrating is made by applying a force to the bundle of thermoelectric semiconductor materials along a direction which is perpendicular to an axis of each of the bar-shaped thermoelectric semiconductor materials.

In accordance with the fourth aspect of the present invention, during the extrusion step, in the thermoelectric semiconductor crystal, flows of materials occur along the direction of the force application or the axial direction of the bar-shaped thermoelectric semiconductor material, which causes orientations of the cleavage planes. In addition, during the integration step, each of the bar-shaped thermoelectric semiconductor materials is applied with the force along a direction perpendicular to its axis, which causes further flows of materials along the direction of the axis, resulting in further orientations of the cleavage planes. Thus, in comparison with a thermoelectric semiconductor obtained through a conventional method, the present invention provides an increased orientation effect as a result of the sintering and integration step, thereby improving the electric conductivity along such a direction. Thus, the first aspect of the present invention provides a thermoelectric semiconductor with an increased performance index.

As a fifth aspect of the present invention, the integrated sintered body of the fourth aspect is deformed by applying a deforming force thereto which causes an extension thereof in Such a manner that a direction of the deforming force is perpendicular to the axis of the each of the thermoelectric semiconductor materials. The direction of the extension of the integrated sintered body is perpendicular to the direction of the deforming force.

In accordance with the fifth aspect of the present invention, flows of materials occur along a direction, or the extension direction which is perpendicular to the direction of the force application, which increases the orientation effect along such a direction. Due to the fact that the direction of the force application is perpendicular to the axis of each of the bar-shaped thermoelectric semiconductor materials which constitutes the sintered body, the direction of the orientation of cleavage planes comes to coincide with the axis, which provides the increased orientation effect, thereby improving electric conductivity. Thus, the fifth aspect of the present invention enables the thermoelectric semiconductor to increase its performance index.

As a sixth aspect of the present invention, the deformation step of the fifth aspect employs a molding device having a cavity whose diameter is larger then a maximum diameter of a plane of the body which is perpendicular to the direction of the deforming force, the body is put in the cavity and is pressed in the cavity along the direction of the deforming force, thereby establishing the extension thereof along the direction perpendicular to the direction of the deforming force.

In accordance with the sixth aspect of the present invention, the body of the thermoelectric semiconductor placed in the cavity of the mold device so as to define a gap between the body and the cavity, which gap is filled up with gas when the body is pressed. Such pressing allows a uniform extension degree of the body during mass production. Thus, constant electric anisotropy of the thermoelectric semiconductor can be reserved, thereby stabilizing the quality and/or performance thereof. In addition, cracks of the thermoelectric semiconductor can be prevented, thereby increasing its mechanical strength.

Furthermore, the thermoelectric semiconductor derived through the inventive method is preferred to have a composition selected from any one of compositions of $Bi_xTe_z$, $Bi_xSb_yTe_z$, $Bi_xTe_zSe$ $\alpha$ and $Bi_xSb_yTe_zSe$ $\alpha$, where $0.2 \leq x \leq 2.0$, $0 < y \leq 1.8$, $2.5 \leq z \leq 3.5$, and $0 < \alpha \leq 0.5$.

In accordance with this seventh aspect of the present invention, the thermoelectric characteristics of the produced thermoelectric semiconductor becomes more excellent than one based on other compositions.

BRIEF DESCRIPTION OF THE DRAWINGS

The above and other objects, features and advantages of the present invention will be more apparent and more readily appreciated from the following detailed description of preferred exemplary embodiments of the present invention, taken in connection with the accompanying drawings, in which.

DETAILED DESCRIPTION OF THE PRESENT INVENTION

Preferred embodiments of the present invention will be described hereinafter in detail with reference to the accompanying drawings.

First Embodiment

A method of producing thermoelectric semiconductor in accordance with a first embodiment of the present invention is mainly made up of:

(a) thermoelectric semiconductor crystal alloy producing step, (b) powdering step, (c) pressing powder step, (d) extrusion step, and (e) sintering and integration step.

(a) thermoelectric semiconductor crystal alloy producing step:

As materials, measured amounts of bismuth(Bi), antimony(Sb), tellurium(Te), and selenium(Se) having a purity of 3N (99.9%) are inputted into a quartz tube so as to constitute a composition of $Bi_{18}Sb_{0.2}Te_{2.85}Se_{0.15}$. Next, for the adjustment of carrier concentration, 0.09 wt % of $(HgBr_2)$ is, as an admixture, added in the quartz tube. Thereafter, the interior of the quartz tube is evacuated with a vacuum pump to equal to or less than 0.1 torr, and the resultant quartz tube is sealed.

Next, the sealed quartz tube is swung around for 1 hour while being heated to a temperature of 700° C., which makes the mixture of the foregoing materials melt and become stirred. Thereafter, the mixture is cooled for recrystallization, which produces a thermoelectric semiconductor crystal alloy.

(b) powdering step:

The thermoelectric semiconductor crystal alloy produced as explained above is then powdered with a well-known grinding or cutter mill. Thereafter, the powder is screened at 166-mesh and therefore only particles are selected whose minimum diameter is equal to or less than 90 μm.

(c) pressing powder step:

The powdered thermoelectric semiconductor crystal alloy (or the thermoelectric semiconductor crystal alloy which is in the form of a powder) consisting of particles having the foregoing diameter is filled in a cavity and is pressed under a pressure of 500 kg/cm², thereby producing a cylinder-shaped pressed powder body of the thermoelectric semiconductor crystal alloy which has a size of 20 mm diameter and a 30 mm height.

Figure 1:
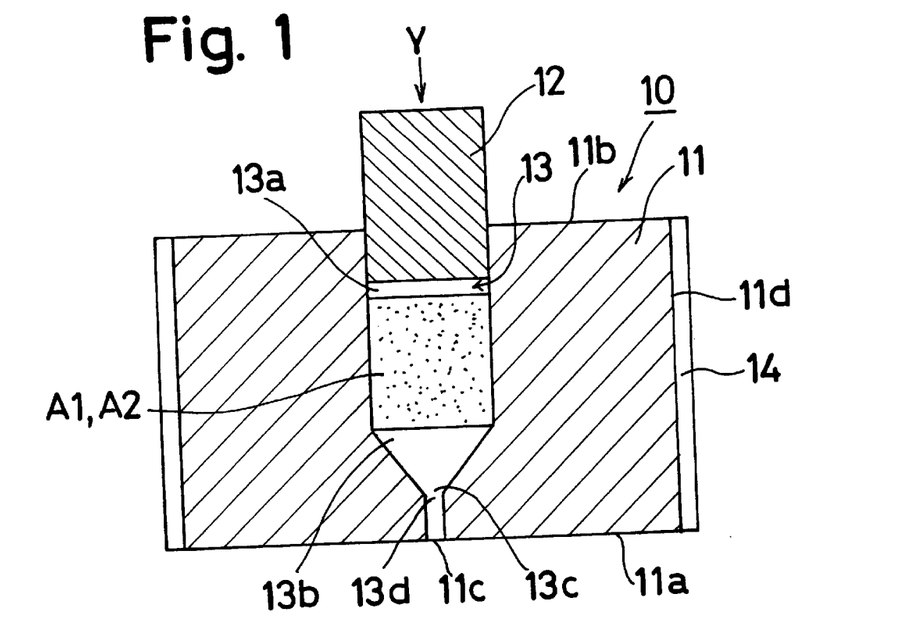
FIG. 1 illustrates a schematic cross-sectional view of a first molding device used for producing thermoelectric semiconductors in accordance with a first embodiment and a second embodiment of the present invention.

(d)extrusion process:

The cylinder-shaped pressed powder body of the thermoelectric semiconductor crystal alloy is put in a first molding device 10 as shown in FIG. 1. In FIG. 1, the first molding device 10 includes a die 11 and a punch 12. The die 11 is formed with a passing-through hole or cavity 13 which extends from an upper or rear surface 11b of the die 11 to a lower or front surface 11a of the die 11. The cavity 13 comprises a larger diameter cylindrical portion 13a which terminates in an opening in the rear surface 11b, a frusto-conical portion 13b which is continuous with the cylindrical portion 13a and a small diameter cylindrical portion 13c which connects to and terminates in a distal end portion 13d of the the frusto-conical portion 13b and which opens in the front surface 11a. The opening in the front surface 11a of the die 11 constitutes an extrusion port 11c.

In this embodiment, the cylindrical portion 13a has a diameter of about 20 mm.

The punch 12 has a cylindrical shape and a diameter of about 20 mm, which is substantially identical with the 20 mm diameter of the cylindrical portion 13a. As shown in FIG. 1, the punch 12 is fitted in the cylindrical portion 13a of the cavity 13 in slidable manner from the rear surface 11b of the die 11.

A circumferential side wall of the die 11 is surrounded or wound with a ring-shaped heater 14 which is electrically coupled with a power source (not shown), thereby warming or heating the die 11 up to a predetermined temperature.

The first molding device 11 is heated by electrically powering the ring-shaped heater 14, and is warmed up to 120° C., thereby setting a extrusion temperature to 120° C. Next, as shown in FIG. 1, the cylinder-shaped pressed powder body A1 of the thermoelectric semiconductor crystal alloy, which is obtained through the pressing powder step, is fitted in the cylindrical portion 13a of the cavity 13. Then the punch 12 is moved downward as indicated by "Y" in such a manner that the body A1 is extruded at a speed of 40 mm/min.

Figure 2:
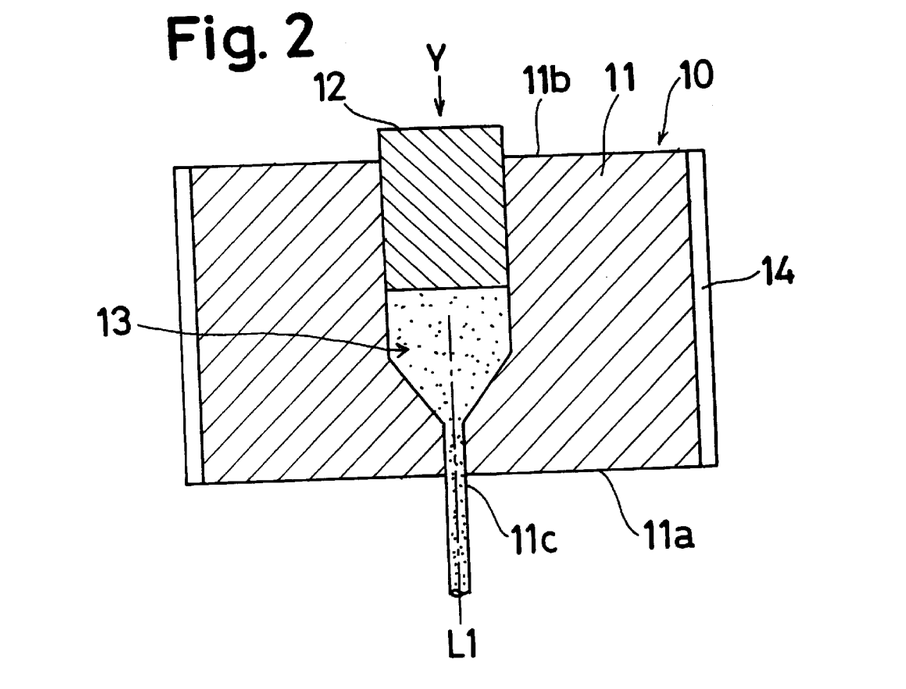
FIG. 2 illustrates a condition of the first molding device when it is in operation wherein a bar shaped member is being extruded therefrom.

The cylinder-shaped pressed powder body A1 of the thermoelectric semiconductor crystal alloy, while it is in the illustrated condition in FIG. 1, receives a downward urging force from the punch 12 in the direction Y. The body A1 also receives a reaction force from an inner wall or surface of the frusto-conical portion 13b. Due to the urging force from the punch 12 and the reaction force from the inner wall or surface of the frusto-conical portion 13b, the body A1 is deformed. At this time, the temperature of the die 12 is 120° C., to prevent sintering the body A1. The resultant or deformed body A1 is extruded through the extrusion opening 11c as a bar-shaped body as shown in FIG. 2. During extrusion of such a bar-shaped body, along its extrusion direction L1, materials pass or stream, thereby arranging cleavage planes of the crystal lattices in the extrusion direction L1.

It is to be noted that the extrusion opening 11c is of 2 mm in diameter and thus an extrusion ratio, which is defined as a ratio of the cylindrical portion 13a to the extrusion opening 11c in cross-section area, is 100.

Figure 3:
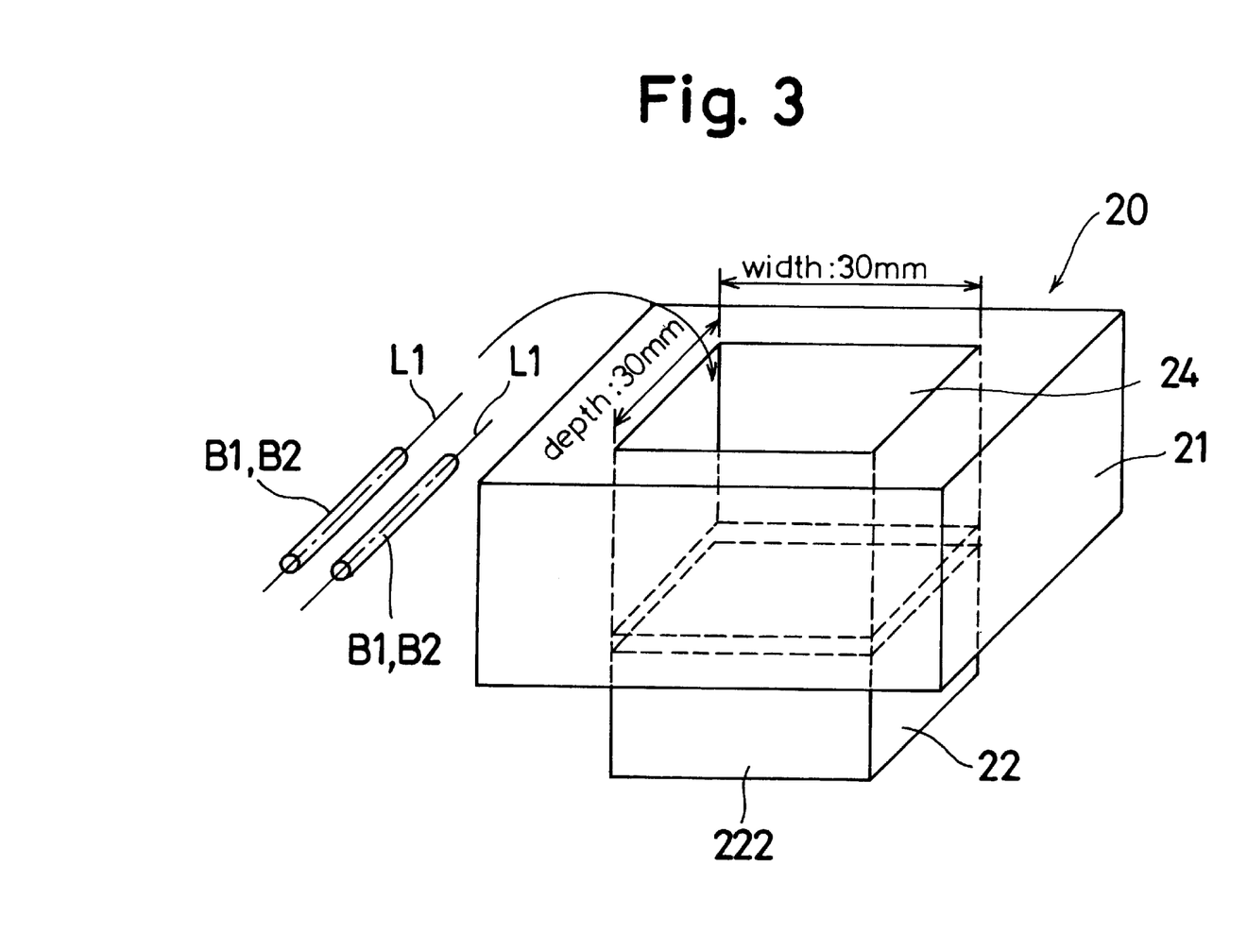
FIG. 3 illustrates a perspective view a second molding device to be used for producing thermoelectric semiconductors in accordance with the first embodiment, the second embodiment, a third embodiment, and a fourth embodiment of the present invention, respectively.
Figure 4:
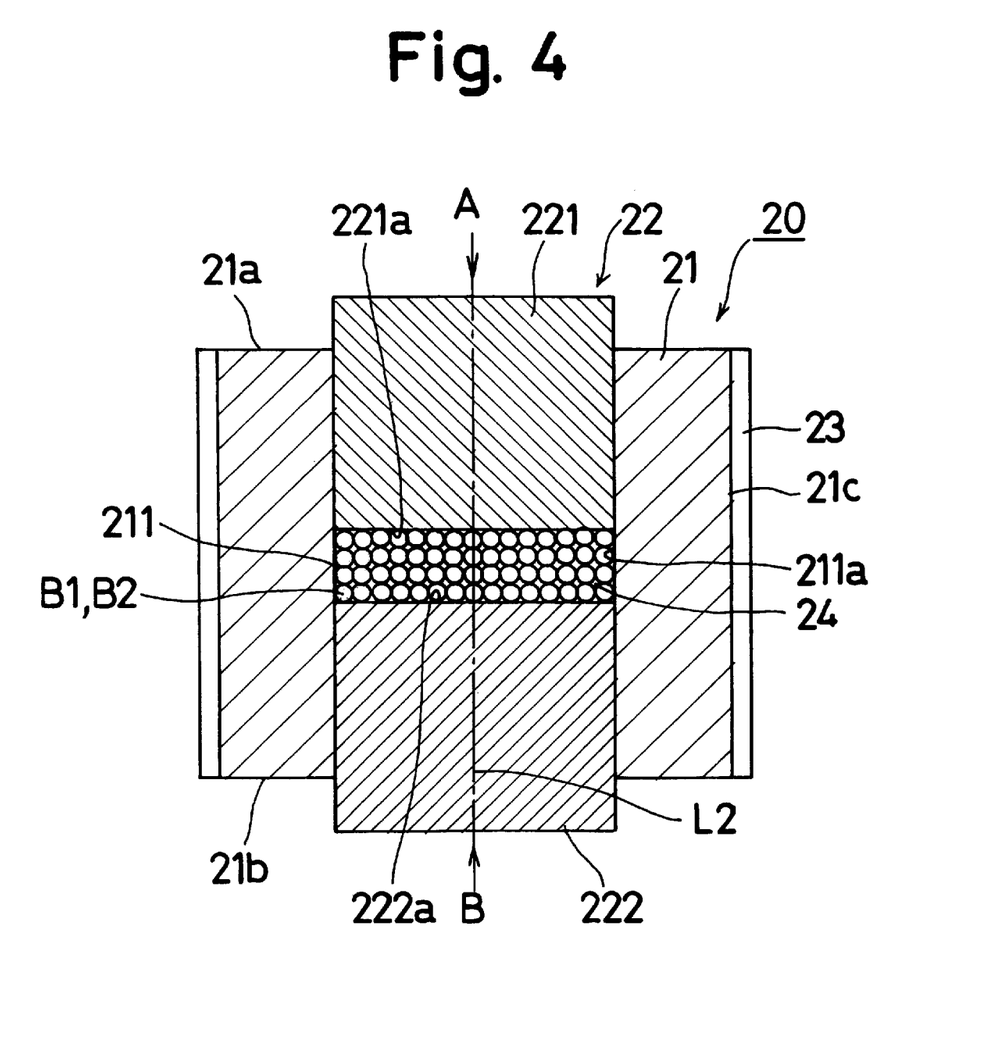
FIG. 4 illustrates a cross-sectional view of the second molding device illustrated in FIG. 3.

(e) sintering and integration step:

With reference to FIGS. 3 and 4, there is illustrated a second molding device 20 which includes a die 21 and a punch 22. The die 21 is configured as a rectangular prism which has an upper surface 21a, a lower surface 21b and a side surface 21c. At a central portion of the die 21, a rectangular hole 211 is formed whose opposite ends are in the form of openings in the respective upper surface 21a and lower surface 21b of the die 21.

Around the side surface 21c, there is provided a rectangular-looped heater 23 (FIG. 4) which is electrically coupled to a power supply, which allows, when the power source is turned on, the heater 23 to warm or heat the die 23 to a predetermined temperature.

The punch 22 includes an upper portion 221 and a lower portion 222. It is to be noted that the upper portion 221 is not illustrated in FIG. 3. Each of the upper portion 221 and the lower portion 222 is of a rectangular cross-section so as to be movable in the rectangular hole 211. In the rectangular hole 211, a lower surface 221a of the upper portion 221 is in opposition to an upper surface 222a of the lower portion 222, which defines a cavity 24 enclosed by the lower surface 221a of the upper portion 221, the upper surface 222a of the lower portion 222, and an inner surface 211a of the rectangular hole 211. The cavity 24 is set to be of 30 mm width and 30 mm depth.

Thus constructed cavity 24 is supplied or provided therein with a plurality of the bar-shaped bodies B1 having a diameter of 2 mm. In detail, as apparent from the illustration in FIG. 2 the bar-shaped bodies are obtained from a continuously extruded bar-shaped body. Such a continuously extruded bar-shaped body is cut into plural bar-shaped bodies B1 having an axial length of 30 mm. The bodies B1 are arranged in a rectangular prism such that axes L1 of two adjacent bar-shaped bodies B1 are parallel to each other. Thereafter, the resultant bar-shaped bodies B1 are compressed by driving the upper portion 221 and the lower portion 222 of the punch 22 in directions 'A' and 'B' respectively. Thus, the direction of the compression force acting on each bar-shaped body B1 having an axis extending in the direction L1 is indicated with L2, which makes a right angle relative to the direction L1. It is noted that the direction L1 in FIG. 4 is perpendicular to the drawing. In this embodiment, the compression force is 450 kg/cm$^2$. The die 21 is warmed to about 400° C. by the square-looped heater 23. Such continuous or successive compression force and heat applications to the bundle of bar-shaped bodies B1 sinters the same to an integrated state or condition.

As described above, in the sintering and integration step, each of the bundled bar-shaped bodies B1 is compressed in the direction L2 which is perpendicular to its axis direction L1, which causes passing or flowing the materials of the bar-shaped body B1 in the direction L1 during its sintering process, thereby arranging the cleavage planes of the crystal lattices in good order.

Figure 5:
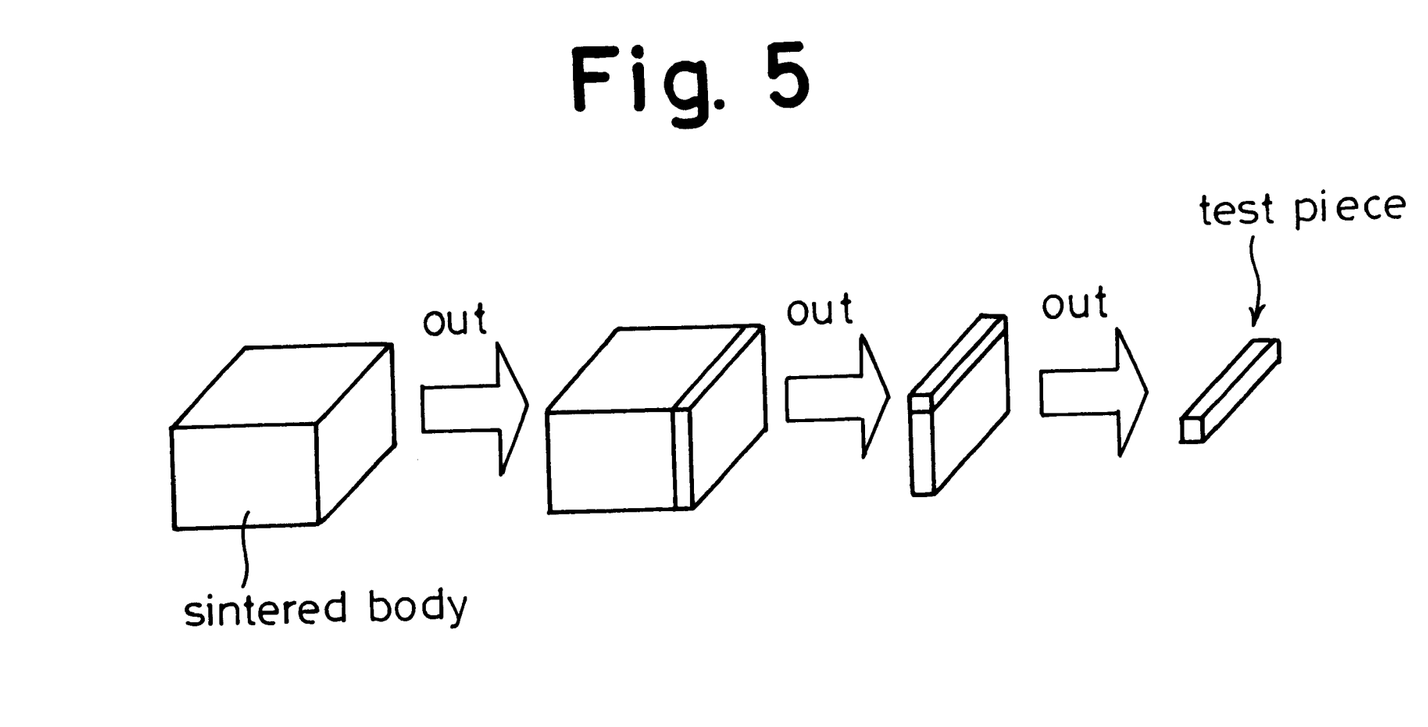
FIG. 5 illustrates a sequential procedure for obtaining test pieces from a sintered member.

The resultant sintered body or integrated plural bar-shaped body B1 is cut into a test piece or sample having a size as shown in FIG. 5. Measurements can be made on this sample to reveal its Seebeck constant (alpha), electrical conductivity (sigma), and heat conductivity (K) in the direction L1. Based on the results of such measurements, a calculation may be made to obtain a performance index (Z) based on the following formula:

$$Z=(\text{alpha}^2 \times \text{sigma})/K$$

Second Embodiment

A method of producing thermoelectric semiconductor in accordance with a second embodiment of the present invention is mainly made up of:

(a) thermoelectric semiconductor crystal alloy producing step, (b) powdering step, (c) pressing powder step, (d) extrusion and sintering step, and (e) integration step.

(a) thermoelectric semiconductor crystal alloy producing step:

As materials, measured amounts of (Bi), (Sb), and (Te) having a purity of 3N (99.9%) are inputted into a quartz tube to constitute a composition of $Bi_{0.5}Sb_{1.5}Te_{3.15}$. Thereafter, the interior of the quartz tube is evacuated with a vacuum pump to be equal to or less than 0.1 torr and the resultant quartz tube is sealed.

Next, the sealed quartz-made tube is swung around for 1 hour while the quartz tube is heated at a temperature of 700° C., which melts and stirs the mixture of the foregoing materials. Thereafter, the mixture is cooled for recrystallization, which produces a thermoelectric semiconductor crystal alloy.

(b) powdering step:

Like the powdering step of the first embodiment, the thermoelectric semiconductor crystal alloy produced as explained above is then powdered with a grinding or cutter mill. Thereafter, the resultant powder is screened at 166-mesh and therefore only particles are selected whose minimum diameter is equal to or less than 90 µm.

(c) pressing powder step:

Like the pressing-powder step of the first embodiment, the powdered thermoelectric semiconductor crystal alloy (or the thermoelectric semiconductor crystal alloy which is in the form of a powder) consisting of particles having the foregoing diameter is filled in a cavity and is pressed under a pressure of 500 kg/cm$^2$, thereby producing a cylinder-shaped pressed powder body of the thermoelectric semiconductor crystal alloy which has a size of 20 mm diameter and 30 mm height.

(d) extrusion and sintering process:

The cylinder-shaped pressed powder body of the thermoelectric semiconductor crystal alloy is inputted in the extruding molding device 10 shown in FIG. 1.

At first, the extruding molding device 11 is heated by energizing the ring-shaped heater 14 so as to be warmed up to 400° C., thereby setting an extrusion temperature of 400° C. Next, as shown in FIG. 1, the cylinder-shaped pressed powder body A2 of the thermoelectric semiconductor crystal alloy, which is obtained at the pressing powder step, is fitted in the cylindrical portion 13a of the cavity 13. Then, the punch 12 is moved downward as indicated with 'Y' with the stroke speed of the punch 12 being controlled to extrude the body A1 from the extrusion hole 11c at a speed of 100 mm/min.

The cylinder-shaped pressed powder body A2 of the thermoelectric semiconductor crystal alloy, while it is in the illustrated condition in FIG. 1, receives a downward urging force from the punch 12. The body A2 also receives a reaction force from the inner wall or surface of the frusto-conical portion 13b. Due to the urging force from the punch 12 and the reaction force from the inner wall or surface of the frusto-conical portion 13b, the body A2 is deformed. At this time, the temperature of the die 11 is 400° C. Due to the heat and the foregoing compression force, the body A2 is sintered. The resultant or deformed and sintered body A2 is extruded through the extrusion opening 1c as a bar-shaped body as shown in FIG. 2. During extrusion of such a bar-shaped body, along its extrusion direction L1, materials pass or stream, thereby arranging cleavage planes of the crystal lattices in the extrusion direction L1.

It is to be noted that the extrusion opening 11c is of 2 mm in diameter and thus an extrusion ratio, which is defined as a ratio of the cylindrical portion 13a to the extrusion opening 11c in cross-section area, is 100.

(e) integration step:

The foregoing extrusion and sintering step provides an extrusion of the bar-shaped body in the form of continuously extruded bar-shaped body. Such a continuously extruded bar-shaped body is cut into plural bar-shaped bodies B2 having an axial length of 30 mm. A bundle of the bar-shaped bodies B2 is arranged so as to constitute a rectangular prism with axes L1 of two adjacent bar-shaped bodies B2 in parallel to each other. Thereafter, the resultant bar-shaped bodies B2 are compressed by driving the upper portion 221 and the lower portion 222 of the punch 22 in directions 'A' and 'B', respectively. Thus, the direction of the compression force acting on each bar-shaped body B1 having an axis extending in the direction L1 is indicated with L2, which makes a right angle relative to the direction L1. The direction L1 in FIG. 4 is perpendicular to the drawing. In this embodiment, the compression force is 450 kg/cm². The die 21 is pre-heated up to about 300° C. by the square-looped heater 23. Due to the continuous or successive compression force and heat which applied to the bundle of bodies B2, the bundle of the bar-shaped bodies B2 is thermally deformed and is integrated or formed into a one-piece structure.

As described above, in the integration step, each of the bundled bar-shaped bodies B2 is compressed in the direction L2 which is perpendicular to its axis direction L1, which causes passing or flowing of the materials of the bar-shaped body B1 in the direction L1 during its sintering process, thereby arranging the cleavage planes of the crystal lattices in good order.

The resultant sintered and integrated bar-shaped body B2 is cut into a test piece or sample having a size as shown in FIG. 5. Measurements can be made on this sample to reveal its Seebeck constant (alpha), electrical conductivity (sigma), and heat conductivity (K) in the direction L1. Based on the results of such measurements, a calculation can be made to obtain a performance index (Z) based on the following formula.

$$Z=(alpha^2 \times sigma)/K$$

Third Embodiment

A method of producing thermoelectric semiconductor in accordance with a third embodiment of the present invention is mainly made up of:

(a) thermoelectric semiconductor crystal alloy producing step, (b) powdering step, (c) pressing powder step, (d) extrusion step, and (e) integration and sintering step, and (f) deformation step.

(a) thermoelectric semiconductor crystal alloy producing step:

As materials, measured amounts of (Bi), (Sb), (Te), and (Se) having a purity of 3N (99.9%) are inputted into a quartz tube so as to constitute a composition of $Bi_{0.5}Sb_{1.5}Te_{3.1}Se_{0.05}$. Next, for the adjustment of carrier concentration, 0.09 wt % ($HgBr_2$) is added in the quartz tube. Thereafter, the interior of the quartz tube is evacuated with a vacuum pump to equal to or less than 0.1 torr and the resultant quartz tube is sealed.

Next, the sealed quartz tube is swung for 1 hour while the quartz tube is heated at a temperature of 700° C., which melts and stirs the mixture of the foregoing materials. Thereafter, the mixture is cooled for recrystallization, which produces a thermoelectric semiconductor crystal alloy.

(b) powdering step:

The thermoelectric semiconductor crystal alloy produced as above is then powdered with a grinding or cutter mill. Thereafter, the resultant powder is screened at 166-mesh and thus only particles are selected whose minimum diameter is equal to or less than 90 µm.

(c) pressing powder step:

The powdered thermoelectric semiconductor crystal alloy or the thermoelectric semiconductor crystal alloy which is in the form of a powder consisting of particles having the foregoing diameter is filled in a cavity and is pressed under a pressure of 500 kg/cm², thereby producing a cylinder-shaped pressed powder body of the thermoelectric semiconductor crystal alloy which has a 20 mm diameter and 30 mm height.

Figure 6:
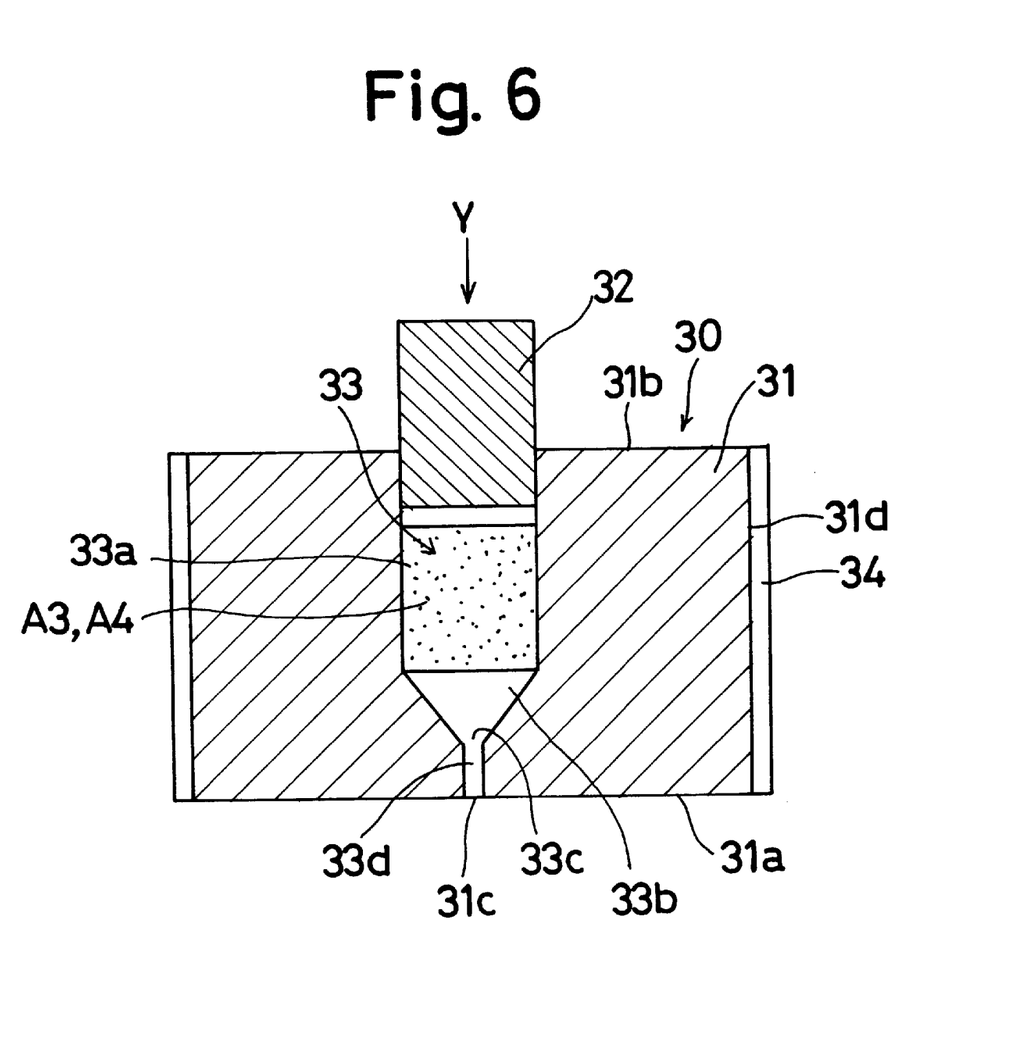
FIG. 6 illustrates a schematic cross-sectional view of a third molding device to be used for producing thermoelectric semiconductors in accordance with the third embodiment and the fourth embodiment of the present invention.

(d) extrusion process:

The cylinder-shaped pressed powder body of the thermoelectric semiconductor crystal alloy is put in the extruding mold device 30 shown in FIG. 6.

The extruding mold device 30 includes a die 31 and a punch 32. The die 31 has a passing-through hole or cavity 33 which extends from an upper surface or a rear surface 31b of the die 31 to a lower surface or front surface 31a of the die 31. The cavity 33 has a larger diameter cylindrical portion 33a which terminates in an opening in the rear surface 31b, a frusto-conical portion 33b which is continuous with the cylindrical portion 33a, and a small diameter cylindrical portion 33c which connects to and terminates in a distal end portion 33d of the an the frusto-conical portion 33b and an opening in the front surface 31a, respectively. The opening in the front surface 31a of the die 31 constitutes an extrusion port 31c.

In this embodiment, the cylindrical portion 33a has a diameter of about 20 mm.

The punch 32 is cylindrical shaped and has a diameter of about 20 mm, which is substantially identical with the diameter of the cylindrical portion 33a. As shown in FIG. 6, the punch 32 is fitted in the cylindrical portion 33a of the cavity 33 in slidable manner from the rear surface 31b of the die 31.

A circumferential side wall of the die 31 is surrounded or wound with a ring-shaped heater 34 which is in electrically coupled with a power source (not shown), thereby warming the die 31 up to a predetermined temperature.

The mold device 31 is heated, by electrically powering the ring-shaped heater 34, to 120° C., thereby setting an extrusion temperature to 100° C. Next, as shown in FIG. 6, the cylinder-shaped pressed powder body A3 of the thermoelectric semiconductor crystal alloy, which is obtained at the pressing powder step, is fitted in the cylindrical portion 33a of the cavity 33. Then the punch 32 is moved downward, as indicated by 'Y', with a stroke speed controlled for extruding the body A1 at a speed of 50 mm/min.

Figure 7:
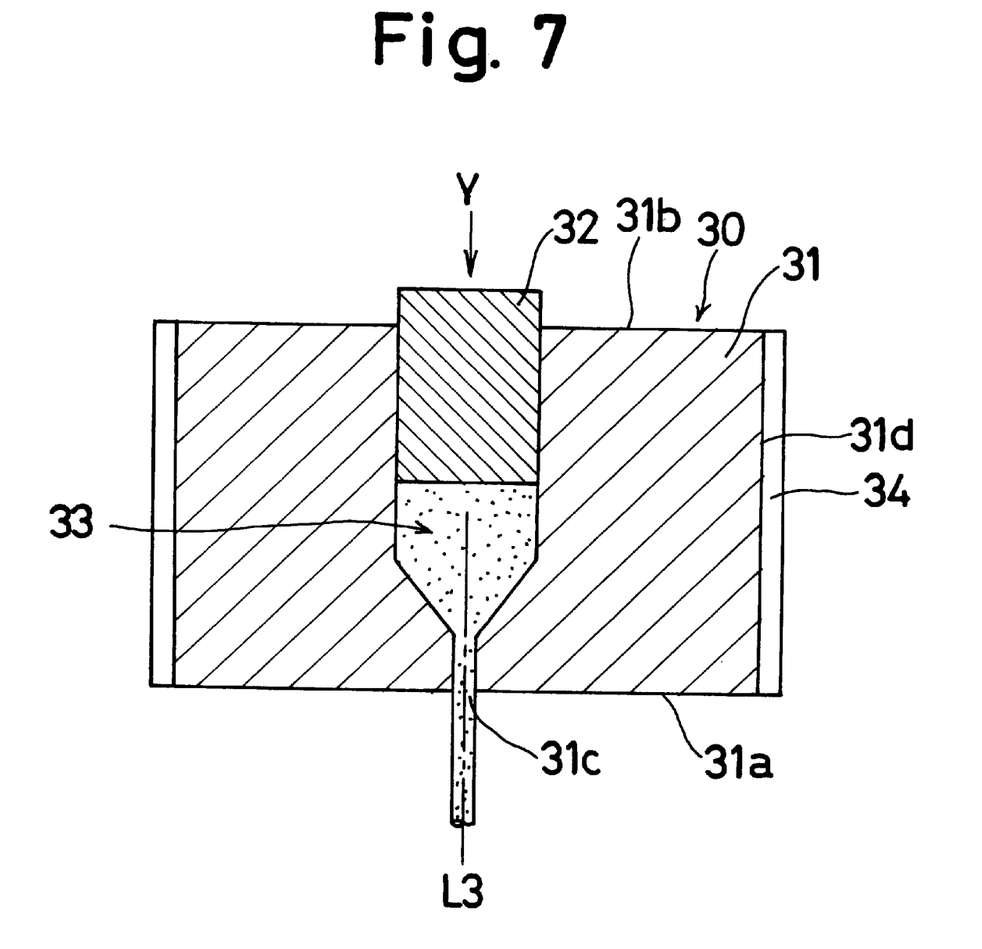
FIG. 7 illustrates a condition of the third molding device when it is in operation wherein a member is being extruded therefrom.

The cylinder-shaped pressed powder body A3 of the thermoelectric semiconductor crystal alloy, while in the illustrated condition in FIG. 6, receives a downward urging force from the punch 32 in the direction Y. The body A3 also receives a reaction force from an inner wall or surface of the frusto-conical portion 33b. Due to the urging force from the punch 32 and the reaction force from the inner wall or surface of the frusto-conical portion 33b, the body A3 is deformed. At this time, the temperature of the die 32 is 100° C., to prevent sintering the body A3. The resultant or deformed body A3 is extruded through the extrusion opening 31c as a bar-shaped body as shown in FIG. 7. During extrusion of such a bar-shaped body, along its extrusion direction L3, materials pass or stream, thereby arranging the cleavage plane of the crystal lattices in the extrusion direction L3.

It is to be noted that the extrusion opening 31c is of 3 mm in diameter and thus an extrusion ratio, which is defined as a ratio of the cylindrical portion 33a to the extrusion opening 31c in cross-section area, is 44.

Figure 8:
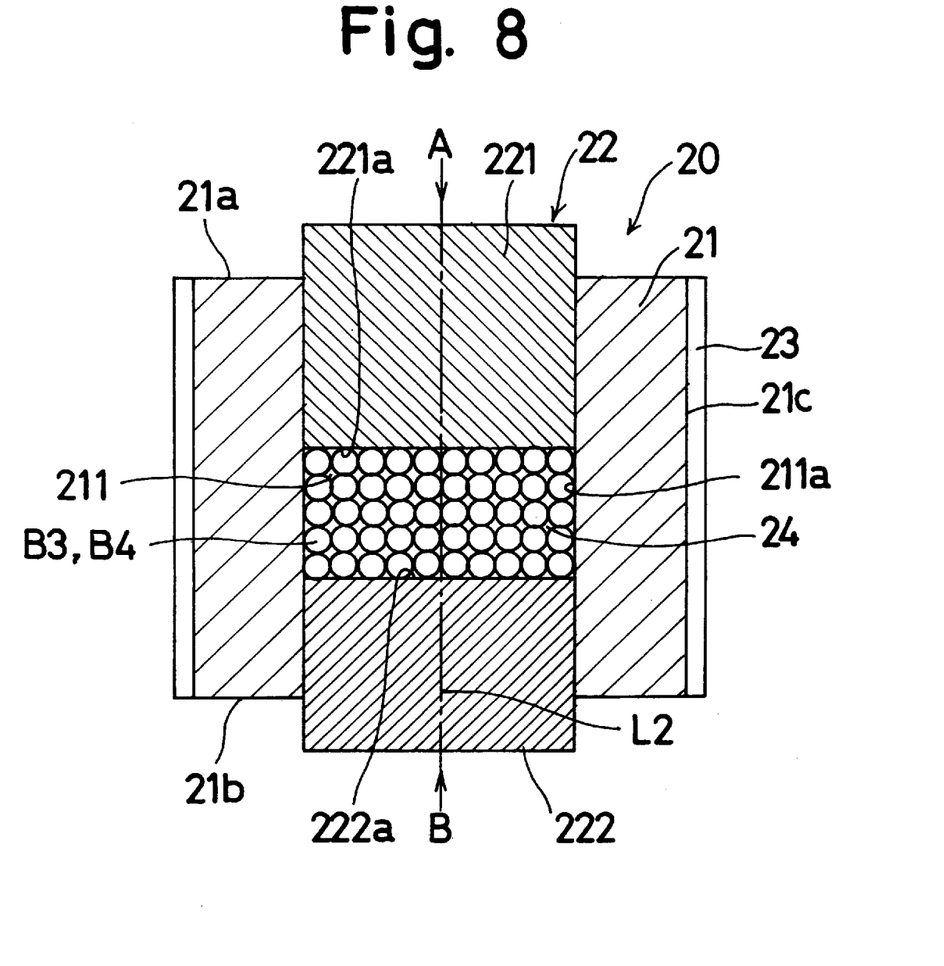
FIG. 8 illustrates a cross-sectional view of a modification of the second molding device show in FIG. 4 which is for the third embodiment and the fourth embodiment.

(e) sintering and integration step:

The foregoing extrusion step provides an extrusion of the bar-shaped body in the form of a continuously extruded bar-shaped body. Such a continuously extruded bar-shaped body having a diameter of 3 mm is cut into plural bar-shaped bodies B3 having an axial length of 30 mm. A bundle of the bar-shaped bodies B3 is arranged in the cavity 24 of the mold device 20 as explained above, to constitute a rectangular prism in which axes L3 of two adjacent bar-shaped bodies B3 are parallel to each other. Thereafter, the resultant bar-shaped bodies B3 are compressed by driving the upper portion 221 and the lower portion 222 of the punch 22 in directions 'A' and 'B', respectively. Thus, the direction of the compression force applied to each bar-shaped body B3, which has an axis extending in the direction L3, will be L2 which makes a right angle relative to the direction L3. It is to be noted that the direction L3 in FIG. 8 is perpendicular to the drawing. In this embodiment, the compression force is set to be 500 kg/cm$^2$. The die 21 is pre-heated up to about 350° C. by the square-looped heater 23. Due to the continuous or successive compression force and heat which are applied to the bundle of bar-shaped bodies B3 for 20 minutes, the bundle of the bar-shaped bodies B3 is sintered and integrated into a one-piece structure.

As described above, in the sintering and integration step, each of the bundled bar-shaped bodies B3 is compressed in the direction L2 which is perpendicular to its axis direction L3, which causes passing or flowing of the materials of the bar-shaped body B3 in the direction L3 during its sintering process, thereby arranging the cleavage plane of the crystal lattices in good order.

(f) deforming step

Figure 10:
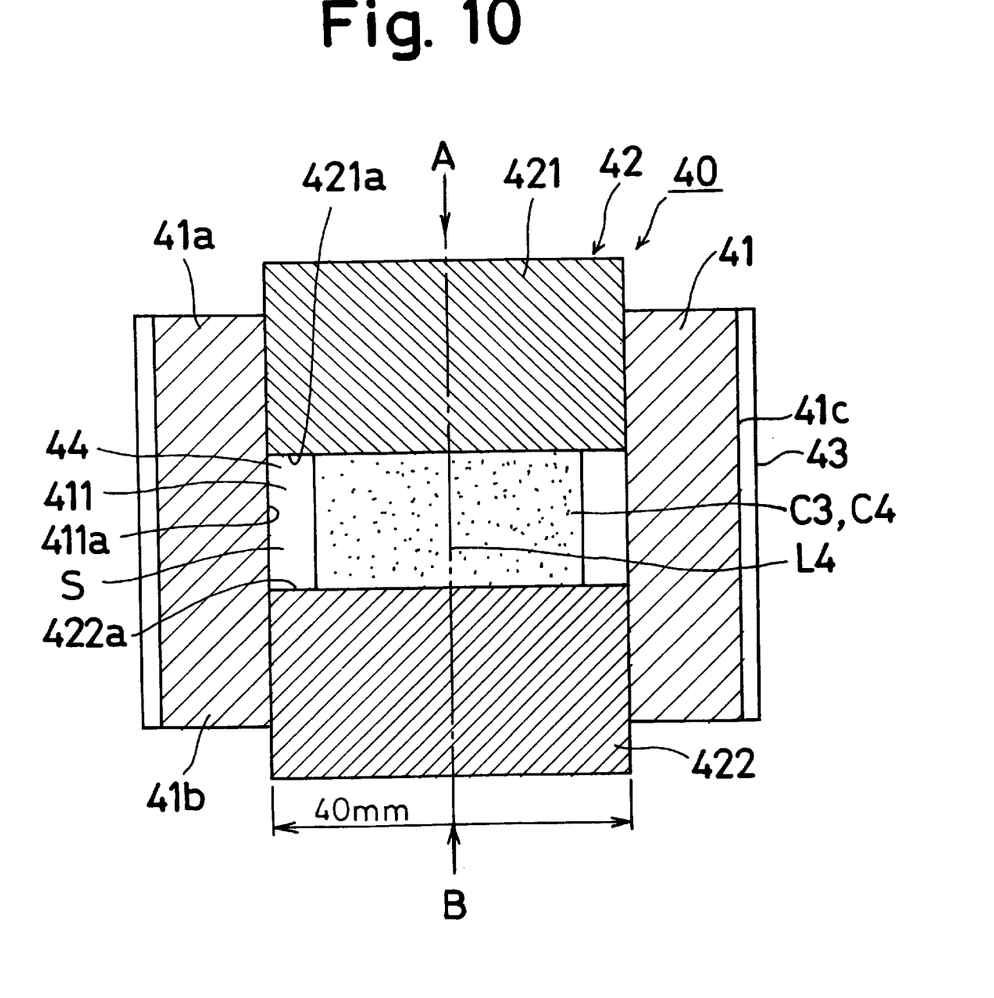
FIG. 10 illustrates a perspective view of a fourth molding device to be used in the third embodiment and the fourth embodiment.

The resultant sintered and integrated bar-shaped body B3 is put into a mold device 40 as shown in FIG. 10. The mold device 40 includes a die 41 and a punch 42. The die 41 is configured as a rectangular prism which has an upper surface 41a, a lower surface 41b, and a side surface 41c. At a central portion of the die 41, a rectangular hole 411 is formed whose opposite ends are in the form of openings in the respective upper surface 41a and lower surface 41b of the die 41.

Around the side surface 41a, there is provided a rectangular-looped heater 43 (FIG. 4) which is electrically coupled to a power supply, which allows, when the power source is turned on, the heater 43 to warm the die 41 to a predetermined temperature of about 380° C.

The punch 42 includes an upper portion 421 and a lower portion 422. Each of the upper portion 421 and the lower portion 422 is of a rectangular cross-section so as to be movable in the rectangular hole 411. In the rectangular hole 411, a lower surface 421a of the upper portion 421 is in opposition to an upper surface 422a of the lower portion 422, which defines a rectangular prism-shaped cavity 44 enclosed by the lower surface 421a of the upper portion 421, the upper surface 422a of the lower portion 422, and an inner surface 411a of the rectangular hole 411. The cavity 44 has a 40 mm width and 40 mm depth.

Figure 11:
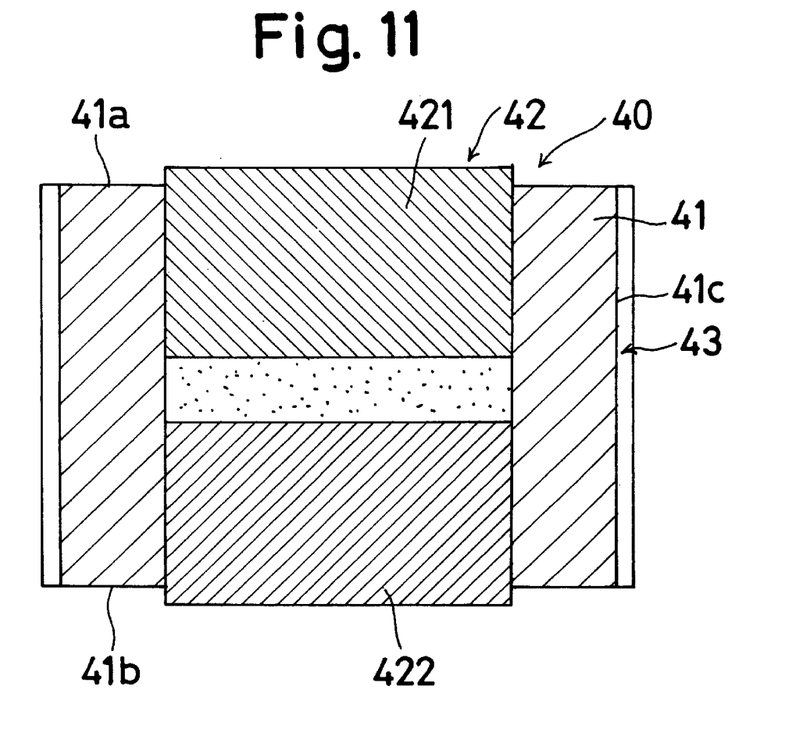
FIG. 11 illustrates how a sintered body is deformed in the fourth molding device shown in FIG. 10.

The integrated sintered body C3 is positioned inside the cavity 44 in such a manner that the axial direction L3 of each of the bar-shaped bodies B3 of the body C3 is perpendicular to a direction L4 along which the punch 42 moves. As shown in FIG. 10, the upper portion 421 and the lower portion 422 of the punch 42 Are moved in directions A and B respectively, which compresses, at a pressure of 420 kg/cm$^2$, the integrated sintered body C3 along the direction L4. The die 41 is heated by the heater 43 to about 380° C. Such applications of pressure and heat are maintained for a time duration of 40 minutes, thereby thermally deforming the integrated sintered body C3. Due to the fact that the cross-section of the cavity 44 and the integrated sintered body C3 have the sizes of 40 mm×40 mm and 30 mm×30 mm, respectively, a gap S of about 5 mm is defined between the integrated sintered body C3 And an inner surface 411a of the cavity 411, which causes the integrated sintered body C3 to expand in a direction which is perpendicular to the pressure-application line axis L3, and fill the gap S. Upon such expansion, material flow occurs, thereby arranging the materials in good order along such a flow. Upon completion of such deformation, the resultant condition is shown in FIG. 11.

Figure 12:
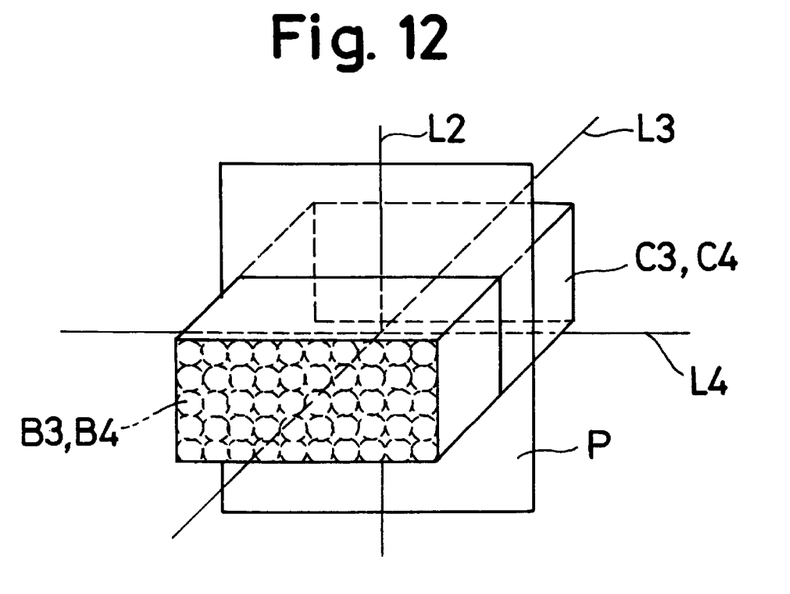
FIG. 12 illustrates a relationship between axes L2, L3, and L4 of the sintered body in the third embodiment and the fourth embodiment.

With reference to FIG. 12, there is illustrated a relationship between the axes L2, L3, and L4 with respect to the integrated sintered body C3. The extending direction of the axis L2 along which the compression force is applied in the sintering and integration step is perpendicular to the axis L3 of the bar-shaped body B3. In addition, the axis L4 as the pressure application direction in the deformation step is perpendicular to the axis L3 of the bar-shaped body B3. Moreover, one of the axes L2 and one of the axes L4 are coplanar with each other in a plane P which is perpendicular to the axis L3. In other words, when one of the axes L2 and one of the axes L4 defines the plane P, the resultant plane P determines the direction of the axis L4 so that the plane P becomes perpendicular to the axis L3. In this case, as shown in FIG. 12, the axis L2 can be perpendicular to the axis L4, i.e., any one of the axes L2, 13, and L4 can be perpendicular to another. The axis L2 can instead be parallel with the axis L4. Such an orientation for axis L4 causes the integrated sintered body C3 to expand during the deformation step in the direction of the axis L3 which is perpendicular to the axis L4, with the result that material flow occurs along the axis L3, thereby orientating the cleavage planes of the materials. Thus the cleavage plane of the crystal lattices are arranged in good order along the axis of each of the bar-shaped bodies.

The deformed integrated sintered body C3 is cut into a test piece or sample having a size as shown in FIG. 5. Measurements can be made on this sample to reveal its Seebeck constant (alpha), electrical conductivity (sigma), and heat conductivity (K) in the direction L3 which is perpendicular to the axes L2 and L4. Based on the results of such measurements, a calculation can be made to obtain a performance index (Z) based on the following formula.

$$Z=(alpha^2 \times sigma)/K$$

Fourth Embodiment

A method of producing thermoelectric semiconductor in accordance with a fourth embodiment of the present invention is mainly made up of:

(a) thermoelectric semiconductor crystal alloy producing step, (b) powdering step, (c) pressing powder step, (d) extrusion and sintering step, (e) integration step, and (f) deformation step.

(a) thermoelectric semiconductor crystal alloy producing step:

As materials, measured amounts of (Bi), (Te), and (Se) having a purity of 3N (99.9%) are inputted into a quartz tube so as to constitute a composition of $Bi_2Te_{2.7}Se_{0.3}$. Next, for adjustment of carrier concentration, 0.09 wt % of ($HgBr_2$) is added to the foregoing mixture of materials. Thereafter, the interior of the quartz tube is evacuated with a vacuum pump to be equal to or less than 0.1 torr and the resultant quartz tube is sealed.

Next, the sealed quartz tube is swung for 1 hour while heated at a temperature of 700° C., which melts and stirs the mixture of the foregoing materials. Thereafter, the mixture is cooled for recrystallization, which produces a thermoelectric semiconductor crystal alloy.

(b) powdering step:

Like the powdering step of the third embodiment, the thermoelectric semiconductor crystal alloy produced as explained above is then powdered with a grinding or cutter mill. Thereafter, the resultant powder is screened at 166-mesh in order to select only particles whose minimum diameter is equal to or less than 90 µm.

(c) pressing powder step:

Like the powdering step of the third embodiment, the powdered thermoelectric semiconductor crystal alloy (or the thermoelectric semiconductor crystal alloy which is in the form of a powder consisting of particles) having the foregoing diameter is filled in a cavity and is pressed under a pressure of 500 kg/cm$^2$, thereby producing a cylinder-shaped pressed powder body of the thermoelectric semiconductor crystal alloy which has a size of 20 mm diameter and 30 mm height.

(d) extrusion and sintering process:

The cylinder-shaped pressed powder body A4 of the thermoelectric semiconductor crystal alloy is put in the extruding molding device 30 shown in FIG. 6.

First the die 31 of the extruding molding device 30 is heated by electrically powering the ring-shaped heater 34, so as to be warmed up to 450° C., thereby setting an extrusion temperature to 450° C. Next, as shown in FIG. 6, the cylinder-shaped pressed powder body A4 of the thermoelectric semiconductor crystal alloy, which is obtained in the pressing powder step, is put in the cylindrical portion 33a of the cavity 33. Then, the punch 32 is moved downward, as indicated with 'Y', at a stroke speed controlled so that the body A4 is extruded from the extrusion hole 31c at a speed of 50 mm/min (extrusion speed: 50 mm/min).

The cylinder-shaped pressed powder body A4 of the thermoelectric semiconductor crystal alloy, while in the illustrated condition in FIG. 6, receives a downward urging force from the punch 32 in the direction Y. The body A4 also receives a reaction force from an inner wall or surface of the frusto-conical portion 33b. Due to the urging force from the punch 32 and the reaction force from the inner wall or surface of the frusto-conical portion 33b, the body A4 is deformed. At this time, the temperature of the die 32 is 450° C. Due to such heat and the foregoing compression forces, the body A4 is sintered. The resultant and sintered body A4 is extruded through the extrusion opening 31c as a bar-shaped body as shown in FIG. 7. During extrusion of the bar shaped body along its extrusion direction L1, materials pass or stream, thereby arranging the cleavage plane of the crystal lattices in the extrusion direction L3.

It is to be noted that the extrusion opening 31c is of 3 mm in diameter and thus an extrusion ratio, which is defined as a ratio of the cylindrical portion 33a to the extrusion opening 31c in cross-section area, is 44.

Figure 9:
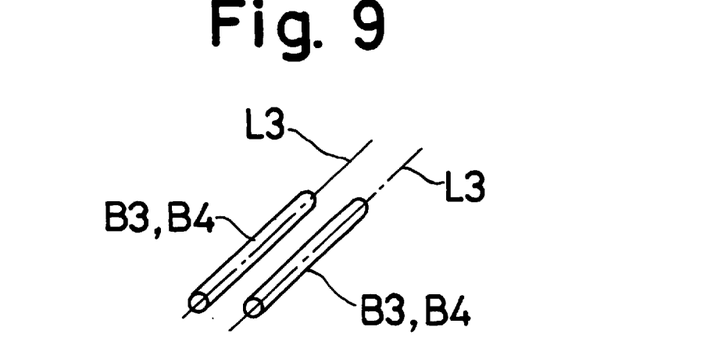
FIG. 9 illustrates bar-shaped bodies produced in the third embodiment and the fourth embodiment.

(e) integration step:

The foregoing extrusion step provides the bar shaped body A4 in the form of a continuously extruded bar-shaped body. Such a continuously extruded bar-shaped body having a diameter of 3 mm is cut into plural bar-shaped bodies B4 which are 30 mm in axial length (FIG. 9). A bundle of the bar-shaped bodies B4 arranged in the cavity 24 of the mold device 20 as explained above is shown in FIG. 8 so as to constitute a rectangular prism in which axes L3 of two adjacent bar-shaped bodies B4 are parallel to each other. Thereafter, the resultant bar-shaped bodies B4 are compressed by driving the upper portion 221 and the lower portion 222 of the punch 22 in directions 'A' and 'B', respectively. Thus, the direction of the compression force applied to each bar-shaped body B4, which has an axis extending in the direction L3, will be L2 which makes a right angle relative to the direction L3. It is to be noted that the direction L3 in FIG. 8 is perpendicular to the drawing. In this embodiment, the compression force is set to be 700 kg/cm$^2$. The die 21 is pre-heated to about 420° C. by the square-looped heater 23. Due to the continuous or successive compression force and heat applied to the bundle of bar-shaped bodies B4, the bar-shaped bodies are thermally deformed and integrated into a one-piece structure.

As described above, in the integration step, each of the bundled bar-shaped bodies B4 is compressed in the direction L2 which is perpendicular to its axis direction L3, which causes passing or flowing the materials of the bar-shaped body B3 in the direction L3 during its integration process, thereby arranging the cleavage plane of the crystal lattices in good order.

(f) deforming step:

The resultant integrated bar-shaped body C4 is put into the mold device 40 as shown in FIG. 10. The mold device 40 includes a die 41 and a punch 42. The die 41 is configured as a rectangular prism which has an upper surface 41a, a lower surface 41b and a side surface 41c. At a central portion of the die 41, a rectangular hole 411 is formed whose opposite ends are in the form of openings in the respective upper surface 41a and lower surface 41b of the die 41.

Around the side surface 41a, there is provided a rectangular-looped heater 43 (FIG. 10) which is electrically coupled to a power supply which allows, when the power source is turned on, the heater 43 to warm the die 43 to a predetermined temperature of about 440° C.

The punch 42 includes an upper portion 421 and a lower portion 422. Each of the upper portion 421 and the lower portion 422 is of a rectangular cross-section so as to be movable in the rectangular hole 411. In the rectangular hole 411, a lower surface 421a of the upper portion 421 is in opposition to an upper surface 422a of the lower portion 422, which defines a rectangular prism-shaped cavity 44 enclosed by the lower surface 421a of the upper portion 421, the upper portion 422a of the lower portion 422, and an inner surface 411a of the rectangular hole 411. The cavity 44 has a 40 mm width and 40 mm depth.

The integrated sintered body C4 is positioned in the cavity 44 such that the axial direction L3 of each of the bar-shaped bodies B4 is perpendicular to a direction L4 along which the punch 42 moves. As shown in FIG. 10, the upper portion 421 and the lower portion 422 of the punch 42 are moved in directions A and B, respectively, which compresses, at a pressure of 600 kg/cm$^2$, the integrated body C4 along the direction L4. The die 41 is heated by the heater 43 to about 440° C. Such applications of pressure and heat are maintained for a time duration of 30 minutes, thereby thermal deforming the integrated body C4. Due to the fact that the cross-section of the cavity 44 and the integrated sintered body C4 have the sizes of 40 mm×40 mm and 30 mm×30 mm, respectively, a gap S of about 5 mm is defined between the integrated sintered body C4 and an inner surface 411a of the cavity 411, which causes the integrated sintered body C3 to expand in a direction perpendicular to the pressure-application line axis L3, to fill the gap S. Upon such extension, material flow occurs, thereby arranging the materials in good order along such a flow direction. Upon completion of such deformation, the resultant condition is shown in FIG. 11.

With reference to FIG. 12, there is illustrated a relationship between the axes L2, L3, and L4 with respect to the integrated sintered body C4. The extending direction of the axis L2 along which the compression force is applied in the sintering and integration step is perpendicular to the axis L3 of the bar-shaped body B4. In addition, the axis L4 as the pressure application direction in the deformation step is perpendicular to the axis L3 of the bar-shaped body B4. Moreover, one of the axes L2 and one of the axes L4 are coplanar with each other in a plane P which is perpendicular to the axis L3. In other words, when one of the axes L2 and one of the axes L4 defines the plane P, the resultant plane P determines the direction of the axis L4 so that the plane P becomes perpendicular to the axis L3. In this case, as shown in FIG. 12, the axis L2 can be perpendicular to the axis L4, i.e., any one of the axes L2, 13, and L4 can be perpendicular to another. The axis L2 can instead be parallel with the axis L4. Such an orientation for axis L4 causes the integrated sintered body C4 to expand, during the deformation step, in the direction of the axis L4 which is perpendicular to the axis L4, with the result that material flow occurs along the axis L3, thereby arranging the materials. Thus, along the axis of each of the bar-shaped bodies, the cleavage planes of the crystal lattices are arranged in good order.

The deformed integrated sintered body C4 is cut into a test piece or sample having a size as shown in FIG. 5. Measurements can be made on this sample to reveal its Seebeck constant (alpha), electrical conductivity (sigma), and heat conductivity (K) in the direction L3 which is perpendicular to the axes L2 and L4. Based on the results of such measurements, a calculation can be made to obtain a performance index (Z) based on the following formula.

$$Z = (alpha^2 \times sigma)/K$$

Comparative Example 1

A cylindrical press-solidified powder body having a diameter and a height of 20 mm and 30 mm, respectively, was made in such a manner that its starting composition, thermoelectric semiconductor crystal alloy producing step, powdering step, and pressing powder step were identical with the first embodiment. Such a pressed powder body was extruded and sintered concurrently in such a manner that an extrusion temperature is 400° C., an extrusion speed is 100 mm/min and an extrusion ratio is 25.

Measurements were made on the resultant sintered body to reveal its Seebeck constant (alpha), electrical conductivity (sigma), and heat conductivity (K) in a direction which is perpendicular to the extrusion direction. Similar to the above, based on these values, a performance index of this sintered body was calculated. The results are shown in Table 2.

Comparative Example 2

A cylindrical press-solidified powder body having a diameter and a height of 20 mm and 30 mm, respectively, was made in such a manner that its starting composition, thermoelectric semiconductor crystal alloy producing step, powdering step, and pressing powders step are identical with the second embodiment. Such a pressed powder body was extruded and sintered concurrently at an extrusion temperature of 400° C., an extrusion speed of 100 mm/min and an extrusion ratio of 25.

Measurements were made on the resultant sintered body to reveal its Seebeck constant (alpha), electrical conductivity (sigma), and heat conductivity (K) in a direction which is perpendicular to the extrusion direction. Similar to the above, based on these values, a performance index of this sintered body was calculated. The results are shown in Table 2.

Comparative Example 3

A cylindrical press-solidified powder body having a diameter and a height of 20 mm and 30 mm, respectively, was made in such a manner that its starting composition, thermoelectric semiconductor crystal alloy producing step, powdering step, and pressing powder step were identical with the third embodiment. Such a press-solidified powder body was extruded and sintered concurrently with an extrusion temperature of 400° C., an extrusion speed of 100 mm/min and an extrusion ratio of 25.

Measurements were made on the resultant sintered body to reveal its Seebeck constant (alpha), electrical conductivity (sigma), and heat conductivity (K) in a direction which is perpendicular to the extrusion direction. Similar to the above, based on these values, a performance index of this sintered body was calculated. The results are shown in Table 2.

Comparative Example 4

A cylindrical press-solidified powder body having a diameter and a height of 20 mm and 30 mm, respectively, was made in such a manner that its starting composition, thermoelectric semiconductor crystal alloy producing step, powdering step, and pressing powder step were identical with the fourth embodiment. Such a pressed powder body was extruded and sintered concurrently with an extrusion temperature of 400° C., an extrusion speed of 100 mm/min and an extrusion ratio of 25.

Measurements were made on the resultant sintered body to reveal its Seebeck constant (alpha), electrical conductivity (sigma), and heat conductivity (K) in a direction which is perpendicular to the extrusion direction. Similar to the above, based on these values, a performance index of this sintered body was calculated. The results are shown in Table 2.

TABLE 1

|  | 1st Embodiment | 2nd Embodiment | 3rd Embodiment | 4th Embodiment |
| --- | --- | --- | --- | --- |
| composition | $Bi_{1.8}Sb_{0.2}Te_{2.85}Se_{0.15}$ | $Bi_{0.5}Sb_{1.5}2Te_{3.15}$ | $Bi_{0.5}Sb_{1.5}Te_{3.1}Se_{0.05}$ | $Bi_2Te_{2.7}Se_{0.3}$ |
| admixture | $HgBr_2$ (0.09 wt %) | — | — | $HgBr_2$ (0.09 wt %) |
| extrusion step/extrusion and sintering step | extrusion ratio 100 extrusion temp. 120° C. extrusion speed 40 mm/min. | extrusion ratio 100 extrusion temp. 400° C. extrusion speed 100 mm/min. | extrusion ratio 44 extrusion temp. 100° C. extrusion speed 50 mm/min. | extrusion ratio 44 extrusion temp. 450° C. extrusion speed 150 mm/min. |
| sintering and integration | cavity size 30 mm × 30 mm | cavity size 30 mm × 30 mm | cavity size 30 mm × 30 mm | cavity size 30 mm × 30 mm |

TABLE 1-continued

|  | 1st Embodiment | 2nd Embodiment | 3rd Embodiment | 4th Embodiment |
|---|---|---|---|---|
| step/integration step | temperature 400 × C. pressure 450 kg/cm$^2$ time duration 30 minutes | temperature 300° C. pressure 400 kg/cm$^2$ time duration 10 minutes | temperature 350° C. pressure 500 kg/cm$^2$ dime duration 20 minutes | temperature 420° C. pressure 700 kg/cm$^2$ time duration 20 minutes |
| deformation step | — | — | cavity size 40 mm × 40 mm temperature 380° C. pressure 420 kg/cm$^2$ time duration 40 minutes | cavity size 40 mm × 40 mm temperature 440° C. pressure 600 kg/cm$^2$ time duration 30 minutes |
| Seebeck coefficient ($\mu$V/K.) | −210 | 211 | 210 | −215 |
| electric conductivity (1/Ω cm) | 1040 | 990 | 1065 | 1092 |
| heat conductivity (W/cm K.) | 0.0123 | 0.0118 | 0.0121 | 0.0124 |
| performance index (×10$^{-3}$/K.) | 3.73 | 3.74 | 3.88 | 4.07 |
| Evaluation | ○ | ○ | ○ | ○ |

TABLE 2

|  | 1st Embodiment | 2nd Embodiment | 3rd Embodiment | 4th Embodiment |
|---|---|---|---|---|
| composition admixture | $Bi_{1.8}Sb_{0.2}Te_{2.85}Se_{0.15}$ $HgBr_2$ (0.09 wt %) | $Bi_{0.5}Sb_{1.5}Te_{3.15}$ | $Bi_{0.5}Sb_{1.5}Te_{3.1}Se_{0.05}$ | $Bi_2Te_{2.7}Se_{0.3}$ $HgBr_2$ (0.09 wt %) |
| extruding and sintering | extrusion ratio 25 extrusion temp. 400° C. extrusion speed 100 mm/min. | extrusion ratio 25 extrusion temp. 400° C. extrusion speed 100 mm/min. | extrusion ratio 25 extrusion temp. 400° C. extrusion speed 100 mm/min. | extrusion ratio 25 extrusion temp. 400° C. extrusion speed 100 mm/min. |
| integration step | — | — | — | — |
| deformation step | — | — | — | — |
| Seebeck coefficient ($\mu$V/K.) | −205 | 209 | 213 | −201 |
| electric conductivity (1/Ω cm) | 920 | 893 | 675 | 1006 |
| heat conductivity (W/cm K.) | 0.0134 | 0.0129 | 0.0122 | 0.0141 |
| performance index (×10$^{-3}$/K.) | 2.89 | 3.02 | 2.51 | 2.88 |
| Evaluation | X | X | X | X |

As apparent from Table 1 Table 2, the performance index of each of the sintered bodies of thermoelectric semiconductor according to the first through fourth embodiments of the present invention exceeds 3.5. By contrast, the performance index of each of the sintered bodies of thermoelectric semiconductor according to the first through fourth comparative examples is less than 3.5. Thus, each of the embodiments is remarkably superior to each of the comparative examples in electric performance. Probably, this is due to the fact the former has better electric conductivity than the latter, while remarkable differences are found therebetween in Seebeck coefficient and thermal conductivity.

In addition, the performance indexes (3.88 and 4.07) of the sintered bodies according to the third embodiment and fourth embodiment are larger than the performance indexes (3.73 and 3.74) of the sintered bodies according to the first embodiment and the second embodiment. The reason is probably as follows: at the deforming step, which comes after the sintering and integration step in the third embodiment and the integration embodiment in the fourth embodiment, further arrangement of the cleavage plane of the crystal lattices is promoted, which increases the electric conductivity over that of the sintered body according to each of the first embodiment and the second embodiment, thereby generating the foregoing difference in performance index.

This invention has thus been shown and description with reference to specific embodiments, however, it should be understood that the invention is in no way limited to the details of the illustrated structure but changes and modifications may be made without departing from the scope of the appended claims.

What is claimed is:

1. A method of producing a thermoelectric semiconductor comprising the steps of:
    extruding one of a powdered thermoelectric semiconductor crystal and a pressed body of a powdered thermoelectric semiconductor crystal along an extrusion direction so as to create a cleavage plane at the crystal lattice in the extrusion direction, to obtain a plurality of bar-shaped thermoelectric semiconductor materials;
    arranging the plural bar-shaped thermoelectric semiconductor materials in side-by-side fashion to form a bundle; and
    applying a force to the bundle of thermoelectric semiconductor materials along a direction perpendicular to an axis of each of the bar-shaped thermoelectric semiconductor materials to thereby sinter and integrate the bundle of plural bar-shaped thermoelectric semiconductor materials to obtain an integrated sintered body, wherein the sintering is done no later than the integrating.

2. A method of producing a thermoelectric semiconductor as set forth in claim 1 further comprising a deforming step of applying a deforming force to the integrated sintered body in a direction perpendicular to the axis of the each of the thermoelectric semiconductor materials to cause an extension thereof, wherein the direction of the extension of the integrated sintered body is perpendicular to the direction of the deforming force.

3. A method of producing a thermoelectric semiconductor as set forth in claim 2, wherein the deformation step is performed with the integrated sintered body in a molding device having cavity whose diameter is larger than a maximum diameter of the body in a plane which is perpendicular to the direction of the deforming force.

4. A method of producing a thermoelectric semiconductor comprising the steps of:
    extruding and sintering concurrently one of a powdered thermoelectric semiconductor crystal and a pressed body of a powdered thermoelectric semiconductor crystal along an extrusion direction so as to create a cleavage plane at the crystal lattice in the extrusion direction, to obtain an a plurality of bar-shaped thermoelectric semiconductor materials;
    arranging the plural bar-shaped thermoelectric semiconductor materials in side-by-side fashion to form a bundle; and
    applying a force to the bundle of thermoelectric semiconductor materials along a direction perpendicular to an axis of each of the bar-shaped thermoelectric semiconductor materials to thereby obtain an integrated sintered body.

5. A method of producing a thermoelectric semiconductor as set forth in claim 4 further comprising a deforming step of applying a deforming force to the integrated sintered body in a direction perpendicular to the axis of the each of the thermoelectric semiconductor materials to cause an extension thereof wherein the direction of the extension of the integrated sintered body is perpendicular to the direction of the deforming force.

6. A method of producing a thermoelectric semiconductor as set forth in claim 5, wherein the deformation step is performed with the integrated sintered body in a molding device having cavity whose diameter is larger than a maximum diameter of the body in a plane which is perpendicular to the direction of the deforming force.

7. A method of producing a thermoelectric semiconductor as set forth in claim 1, wherein the thermoelectric semiconductor crystal is selected from any one of compositions of $Bi_xTe_z$, $Bi_xSb_yTe_z$, $Bi_xTe_zSe\ \alpha$, and $Bi_xSb_yTe_zSe\ \alpha$, where $0.2 \leq x \leq 2.0$, $0 < y \leq 1.8$, $2.5 \leq z \leq 3.5$, and $0 < \alpha \leq 0.5$.

8. A method of producing a thermoelectric semiconductor as set forth in claim 4, wherein the thermoelectric semiconductor crystal is selected from any one of compositions of $Bi_xTe_z$, $Bi_xSb_yTe_z$, $Bi_xTe_zSe\ \alpha$, and $Bi_xSb_yTe_zSe\ \alpha$, where $0.2 \leq x \leq 2.0$, $0 < y \leq 1.8$, $2.5 \leq z \leq 3.5$, and $0 < \alpha \leq 0.5$.

* * * * *